United States Patent
Li et al.

(10) Patent No.: US 6,770,570 B2
(45) Date of Patent: Aug. 3, 2004

(54) METHOD OF FORMING A SEMICONDUCTOR DEVICE WITH A SUBSTANTIALLY UNIFORM DENSITY LOW-K DIELECTRIC LAYER

(75) Inventors: Lih-Ping Li, Hsin-Chu (TW); Hsin-Hsien Lu, Hsin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/295,609

(22) Filed: Nov. 15, 2002

(65) Prior Publication Data

US 2004/0097099 A1 May 20, 2004

(51) Int. Cl.[7] .............................................. H01L 21/469
(52) U.S. Cl. ...................... 438/766; 438/763; 438/764; 438/765; 438/710
(58) Field of Search ................................ 438/618, 622, 438/624, 637, 778, 779, 787

(56) References Cited

U.S. PATENT DOCUMENTS

| | | |
|---|---|---|
| 6,124,216 A | 9/2000 | Ko et al. |
| 6,140,226 A | 10/2000 | Grill et al. |
| 6,147,009 A | 11/2000 | Grill et al. |
| 6,162,743 A | 12/2000 | Chu et al. |
| 6,194,128 B1 | 2/2001 | Tao et al. |
| 6,211,061 B1 | 4/2001 | Chen et al. |
| 6,251,806 B1 | 6/2001 | Chang et al. |
| 6,294,457 B1 | 9/2001 | Liu |
| 6,309,957 B1 | 10/2001 | Tu et al. |
| 6,312,793 B1 | 11/2001 | Grill et al. |
| 6,319,809 B1 | 11/2001 | Chang et al. |
| 6,342,448 B1 | 1/2002 | Lin et al. |
| 6,372,661 B1 | 4/2002 | Lin et al. |
| 6,486,082 B1 * | 11/2002 | Cho et al. .................... 438/789 |
| 6,583,043 B2 * | 6/2003 | Shroff et al. ................. 438/618 |
| 6,593,251 B2 * | 7/2003 | Baklanov et al. ............ 438/778 |

* cited by examiner

*Primary Examiner*—David Nelms
*Assistant Examiner*—Renee R. Berry
(74) *Attorney, Agent, or Firm*—Slater & Matsil, L.L.P.

(57) ABSTRACT

A semiconductor device 100 includes a low-k dielectric insulator 104. In the preferred embodiment, a low-k dielectric material 104 is deposited. This material 104 is then cured using a plasma cure step. The cure process causes the density of the top portion 106 of layer 104 to be increased. The higher density portion 106, however, also has a higher dielectric constant. As a result, the dielectric constant of the layer 104 can be reduced by removing this higher density portion 106. This leads to a lower dielectric constant (e.g., less than about 3) of the bulk film.

9 Claims, 3 Drawing Sheets

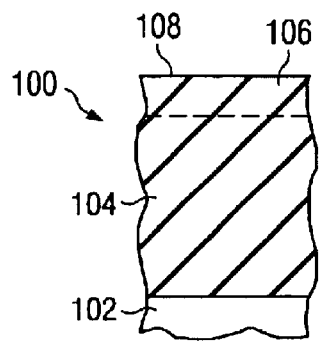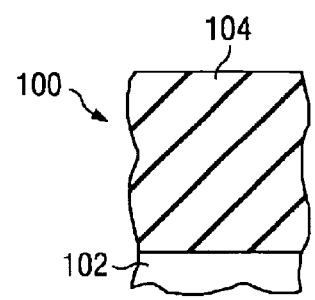
FIG. 1   FIG. 2
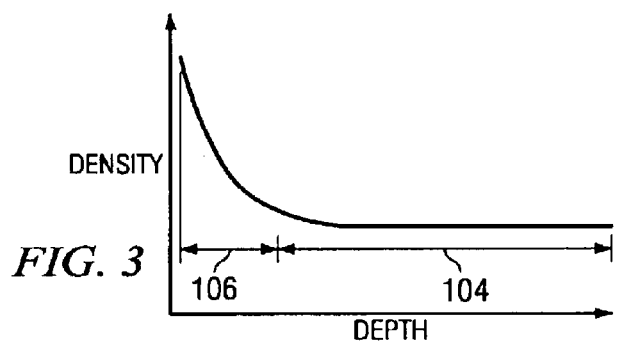
FIG. 3
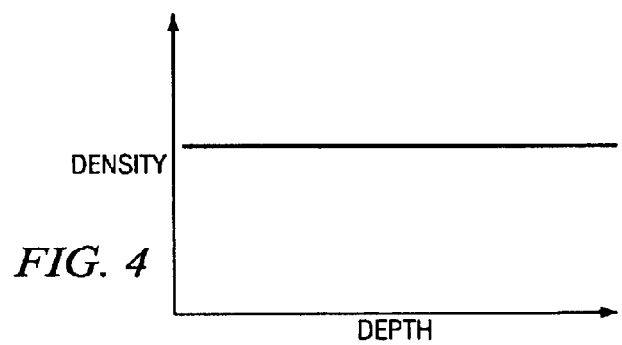
FIG. 4
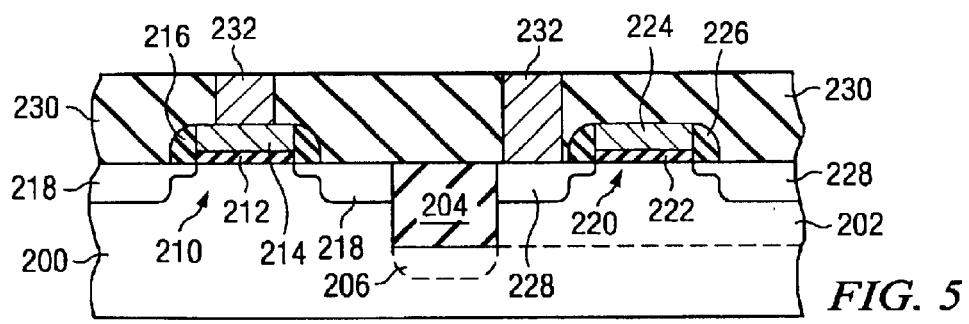
FIG. 5

US 6,770,570 B2

METHOD OF FORMING A SEMICONDUCTOR DEVICE WITH A SUBSTANTIALLY UNIFORM DENSITY LOW-K DIELECTRIC LAYER

TECHNICAL FIELD

The present invention relates generally to semiconductor devices, and more particularly to a method of forming a semiconductor device with a substantially uniform density low-k dielectric layer.

BACKGROUND

Modern advances is semiconductor technology have led to smaller feature sizes and higher density devices. One of the issues that arises as dimensions shrink is the capacitance between adjacent conductors in a device. As individual conductors experience higher parasitic capacitances, the conductors tend to charge more slowly thereby decreasing the peak speeds at which the chip can operate. In addition, it is possible that adjacent conductors can interfere with one another through cross talk.

One technique that has been used to speed up the peak frequency of semiconductor devices is to use conductive materials that have lower resistivity. For example, a copper conductor will have a lower resistance than a similar geometry aluminum conductor. The lower resistance conductor will lower the RC time constant for switching on the lines.

A technique to lower the parasitic capacitance is the use of lower dielectric constant (low-k) materials as the insulator between materials. Silicon dioxide has a dielectric constant of about 4. Materials such as SILK™ available from Dow Chemical or FLARE™ available from Honeywell have a lower dielectric constant that silicon dioxide and have been used in these applications. Other low-k materials include Black Diamond (BD) from Applied Materials and LKD (low k dielectric) from JSR Micro, Inc.

SUMMARY OF THE INVENTION

In several aspects, the present invention relates to a process and device that includes a low-k dielectric insulator. In the preferred embodiment, a low-k dielectric material is deposited This material is then cured using a plasma cure step. The cure process causes the density of the top layer to be increased. The higher density portion, however, also has a higher dielectric constant. As a result, removing this higher density portion can reduce the dielectric constant of the layer. This leads to a lower dielectric constant of the bulk film.

In a first embodiment, a layer of low-k dielectric material is formed. This layer can be a SiCOH layer formed, for example, by chemical vapor deposition or by spin on deposition. A plasma cure is performed on the layer of low-k dielectric material. After performing the plasma cure, a top portion of the layer of low-k dielectric material is removed.

In a more specific embodiment, the present invention has application in a CMOS process, possibly using copper damascene interconnects. In this example, a number of CMOS transistors are formed in a semiconductor region (e.g., substrate, SOI layer, or other). An insulating layer, such as silicon dioxide, is formed over the transistors. A low-k dielectric material can then be formed over the insulating layer and plasma cured. A top portion of the low-k dielectric material is then removed. To form the interconnect, a trench is formed within the low-k dielectric material and filled with a conductive material, e.g., copper.

A preferred embodiment semiconductor device includes a plurality of CMOS transistors. An oxide layer overlies the plurality of transistors and a low-K dielectric layer, such as a SiCOH layer, overlies the oxide layer. The low-k layer has a substantially uniform density of between about 0.5 and about 1.5 and a dielectric constant at or below 3.0. A copper conductor is disposed within a trench in the low-k layer and a plurality of contacts extend through the SiCOH layer and the oxide layer to connect selected ones of the CMOS transistors with the copper conductor.

An advantage of preferred embodiments of the present invention is that the effective dielectric constant of an interlevel dielectric layer can be reduced. The process is relatively simple and does not require any proprietary process steps or any additional masking or other lithography.

DESCRIPTION OF THE DRAWINGS

For a more complete understanding of the present invention, and the advantages thereof, reference is now made to the following descriptions taken in conjunction with the accompanying drawing, in which:

FIGS. 1 and 2 provide simplified cross-section views illustrating a preferred embodiment process;

FIG. 3 shows a density profile of a low-k dielectric layer after plasma cure;

FIG. 4 shows a density profile of the layer of FIG. 3 after a top portion of the layer is removed; and FIGS. 5–9 provide cross-sectional views of a more specific process that utilizes aspects resent invention.

DESCRIPTION OF ILLUSTRATIVE EMBODIMENTS

Figure 6:
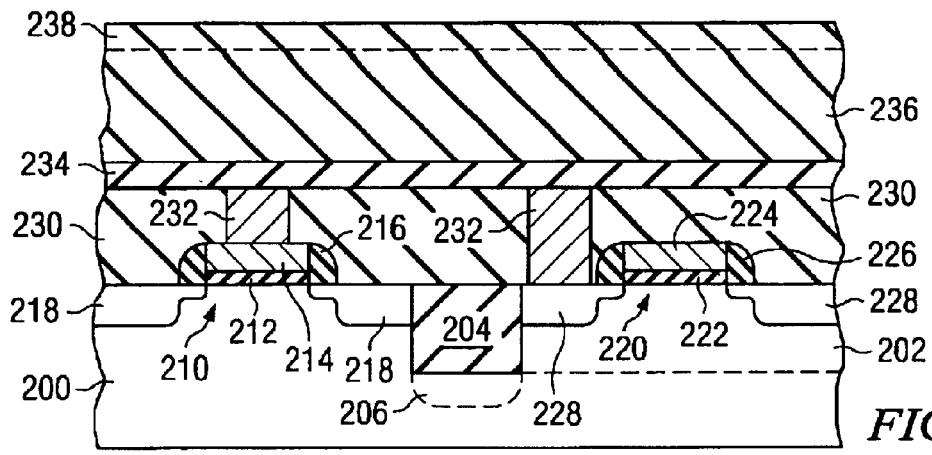

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device utilizing a plasma cured dielectric layer. The invention may also be applied, however, to other situations. For example, the density issues discussed below (see e.g., FIGS. 3 and 4 and related text) can also occur from other processes such at thermal processing.

FIGS. 1 and 2 show a simplified example of a first embodiment. FIGS. 5–8 are provided for the purposes of illustration and show a more specific embodiment.

FIG. 1 illustrates a small portion of a semiconductor device 100. An underlying layer 102 is provided. In the preferred embodiment, the layer 102 is an etch stop layer formed, for example, from a material such as silicon nitride (e.g., $Si_3N_4$) or silicon carbide. It is understood, however, that layer 102 can be any layer or material that supports low-k dielectric layer 104, including a semiconductor (e.g., silicon), a conductor (e.g., a metal or a silicide), or another insulator, as examples.

Low-k dielectric layer 104 is preferably hydrogenated oxidized silicon carbon material (SiCOH) or compounds thereof. Other materials such as silicon-containing materials such as amorphous hydrogenated silicon (a-Si:H), $SiO_xN_y$, SiC, SiCO, SiCH and compounds of these materials could alternatively be used. Layer 104 may alternatively comprise a low-k polymer (e.g., an organic polymer such as a polyimide, parylene, polyarylether, organo-silicone, polynaphthalene, polyquinoline, or copolymers thereof); an SOG material (e.g., HSG or MSG); or porous materials such as xerogels and others that include templated pores. In general, a low-k dielectric can be any dielectric with a dielectric constant lower than that of silicon dioxide.

In typical embodiments, the low-k dielectric layer can be formed by chemical vapor deposition (CVD) or by spin-on deposition (SOD). In the case of CVD, a precursor such as tetramethyl silane (4MS), trimethyl silane (3MS), octamethylcyclotetrasiloxane (OMCTS), tetraoxymethylcyclotetrasiloxane (TOMCTS), can be used with $H_2$, $O_2$, $N_2$, and/or He combination gas. The flow rate could be between about 20 and about 2000 sccm and the deposition time between about 1 and about 100 sec. depending on the thickness. The thickness will typically be between about 150 and 180 nm. In this process, the pressure is typically between about 1 and about 20 torr and the temperature between about 10° C. and about 500° C.

In the case of SOD, a precursor such as tetraethyloxysilane (TEOS), methyltriethoxysilane (MTEOS) and/or an organic-inorganic hybride material can be used. The layer can be baked at a temperature between about 150° C. and 450° C.

The low-k dielectric goes through processing that causes the density of a top portion of the layer to be higher than the remaining portion. This phenomenon is shown in FIG. 1 by the dashed lined portion 106 and in the graph of FIG. 3. Referring now to FIG. 3, the density of the layer 104 is shown as a function of the depth from upper surface 108 down to underlying layer 102. As shown in the graph, the top portion 106 has a higher density than the remainder of the layer 104.

In the preferred embodiment, a plasma cure was performed on the low-k dielectric layer 104 after deposition. In the preferred embodiment, the plasma cure step is performed in the presence of an $N_2/H_2$ gas. The power could be set to a level between about 50 W and about 3000 W (preferably about 2000 W), the pressure set to between about 1 torr and about 7 torr (preferably about 4 torr), and the temperature set to between about 30° C. and about 450° C. The time will depend upon the thickness of the layer 104 and is typically in the range of between about 10 sec. and about 600 sec. A side effect of the cure is to increase the density at the top portion 106.

Generally, the dielectric constant of a material will increase as the density increases. This fact can be understood by considering that air has a low dielectric constant so that as more air is included in the material (e.g., the density of the material goes down) the effective dielectric constant of the material will go down. In applications where low dielectric constant is desirable, such as dielectrics for interconnects, one goal is to lower the effective dielectric constant of the entire layer.

FIG. 2 shows the portion of semiconductor device 100 after the top portion 106 has been removed. As shown in FIG. 4, the density of the low-k dielectric layer 104 is now uniform and the effective dielectric constant is lower than that of the layer illustrated in FIG. 106. In the preferred embodiment, the density of layer 104 is between about 0.5 and about 1.5 (preferably about 1.0). More importantly, the dielectric constant is preferably below about 3.0, typically between about 1.5 and about 3.0 (e.g., about 2.0).

The top portion 106 of dielectric layer 104 can be removed in any of a large number of ways. Just a few of these ways will be described as examples. For example, the top portion 106 can be etched away using a fluorine-containing gas. As a more specific example, the top portion 106 could be etched using a fluorine-containing gas at a temperature between room temperature (e.g., about 25° C.) and high temperature (e.g., about 400° C.), a power of about 200 W, and a pressure of about 4 torr.

As another example, the top portion 106 could be removed by a chemical mechanical polish (CMP), e.g., using an oxide slurry. In other examples, the layer 106 is removed by wet chemical etch, with in situ HF vapor, or by physical methods such as argon sputtering. Other methods are also possible.

In the preferred embodiment, the low-k dielectric layer 104 (including top portion 106) is deposited to a thickness of 100 nm and about 700 nm (preferably about 500 nm). The thickness of the portion to be removed should be enough to make the density profile substantially uniform (see FIG. 4) and also maintain the structural and isolation objective of the layer. Typically, between about 5% and about 25% (preferably about 15%) of the layer will be removed. For example, in a preferred embodiment, the top portion 106 is between about 10 nm and about 150 nm (preferably about 80 nm) thick.

Referring now to FIGS. 5–8, a more specific example of a process that can utilize concepts of the present invention will be described. In particular, aspects of the present invention can be used with a CMOS process that utilizes dual damascene copper metalization with low-k inter-metal insulation. This embodiment describes just one example. Many other processes could also utilize the present invention.

Referring first to FIG. 5, a semiconductor region 200 is provided. Semiconductor region 200 typically comprises a lightly doped monocrystalline silicon layer. For example, the semiconductor region 200 can comprises a silicon substrate or a layer upon (e.g., an epitaxial layer or an SOI (silicon on insulator) layer) or within (a well such as in a triple well structure) a silicon substrate.

Since a CMOS process is being described, two transistors are illustrated. N-channel MOS transistor 210 is formed in the semiconductor region 200 while p-channel MOS transistor 220 is formed in an n-well 202. This configuration assumes that the semiconductor region 200 was a lightly doped p-region. If an n-type region 200 is utilized then the n-channel transistor 210 would be formed in the well 202. It is also possible that both transistors 210 and 220 are formed in well regions.

Aspects of the present invention are especially useful in small sized technologies. For example, the integrated circuit that includes transistors 210 and 220 can be formed using 0.13 μm or 90 nm technology or even smaller. In these cases, the transistor channel lengths (of most if not all of the transistors) will be about 0.13μ and 90 nm or less, respectively. It is expected that the present invention will also be useful at smaller dimensions, e.g., for a physical gate length of 45 nm or less.

N-channel transistor 210 is isolated from p-channel transistor by a shallow trench isolation (STI) region 204. The STI region 204 is formed from a trench about 2500 to about 4000 Å deep in a 6000 Å layer. The trench is filled with an insulator, such as silicon dioxide, as an example. A more heavily doped semiconductor region 206 can optionally be formed to provide further isolation. Alternatively, other isolation, such as field isolation, can be utilized.

To form transistor 210 (220), a gate dielectric layer 212/222 and a gate layer 214/224 are formed. In the preferred embodiment, a single the gate dielectric layer and a single gate layer are used for both transistors 210 and 220. Either of these layers can be a compound layer. For example, gate layer 214/224 might comprise a polysilicon layer and a silicide layer.

The gate layer 214/224 can then be etched to form gates 214 and 224. A lightly doped implant is then formed for each transistor region. Resist can be used to protect the region that is not being doped. Sidewall spacers 216 and 226 are then formed over both gates followed by more heavily doped implants for each transistor. These implants, preferably using arsenic and/or phosphorus for the n-channel device and boron for the p-channel device, form the source/drain regions 218 and 228 of the transistors 210 and 220, respectively. Once again, resist can be used to protect the region that is not being doped.

A dielectric layer 230 is formed over the device. This dielectric layer typically comprises an oxide such as silicon dioxide or a doped glass such as phosphosilicate glass (PSG) or borophosphosilicate glass (BPSG). Vias are formed in the dielectric layer 230 and filled with conductive material to form contacts (or plugs) 232. As an example, the conductive material could be tungsten. Two contacts 232 are illustrated as being connected to two arbitrarily chosen regions. It is understood that more (or fewer) contacts could be used and could contact whichever regions the particular design requires.

Referring now to FIG. 6, an etch stop layer 234 is formed over the insulating layer 230 and contacts 232. Silicon nitride (e.g., $Si_3N_4$) or silicon carbide (SiC) may be used as this etch stop layer 234 to improve adhesion with the overlying inter metal dielectric layer 236. In one example, the etch stop layer 234 is deposited to a thickness of between about 10 nm and about 60 nm, and preferably about 50 nm.

A low-k dielectric layer 236 can now be deposited over the etch stop layer 234 to a thickness of between about 200 nm and about 800 nm, preferably about 500 nm. This layer 234 corresponds to the layer 104 discussed above with respect to FIGS. 1–4. As discussed above, this layer can be plasma cured resulting in a top portion 238, which has a higher dielectric constant than the remaining portion of the layer.

Figure 7:
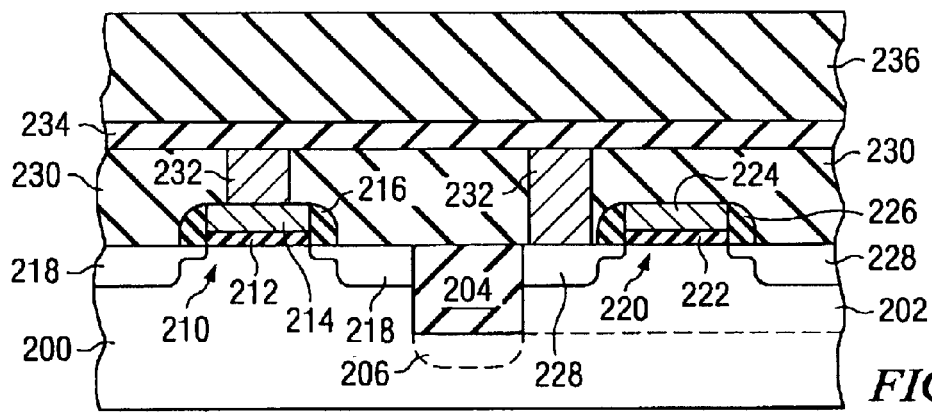

As shown in FIG. 7, this upper portion 238 is removed from the remaining dielectric layer 236. In the preferred embodiment, the low-k dielectric constant comprises SICOH and has a substantially uniform density of between about 0.8 and about 1.2 and a dielectric constant below about 3.0. The discussion provided above with respect to FIGS. 2 and 4 applies here as well and, for the sake of simplicity, will not be repeated.

Figure 8:
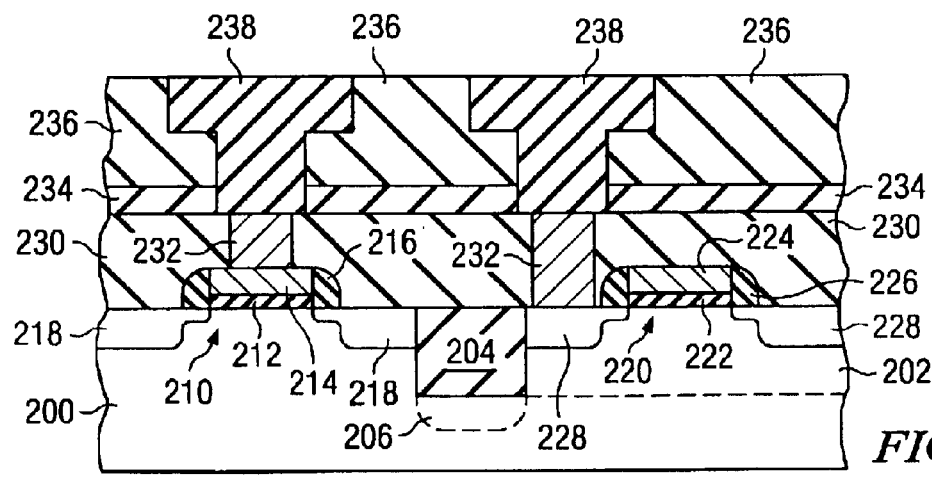

Referring now to FIG. 8, a dual damascene interconnect structure is shown. The illustration of this structure includes two contacts and lines 238, although it is understood that other configurations can be used. While a dual damascene process is illustrated, it should be understood that other processes such as single damascene or contact via formation techniques (as shown for contacts 232) could be used.

In the dual damascene process, trenches are formed within the dielectric layer 236 and contact holes are formed with the trenches to contact selected portions beneath the dielectric layer 236. The trenches and contact vias can then be filled with a metal, preferably copper. Further details on dual damascene processes that include low-k dielectric layers can be found in the following patents, each of which is incorporated herein by reference—U.S. Pat. No. 6,342,448 entitled "Method of fabricating barrier adhesion to low-k dielectric layers in a copper damascene process," U.S. Pat. No. 6,319,809 entitled "Method to reduce via poison in low-k Cu dual damascene by UV-treatment," and U.S. Pat. No. 6,211,061 entitled "Dual damascene process for carbon-based low-K materials."

Figure 9:
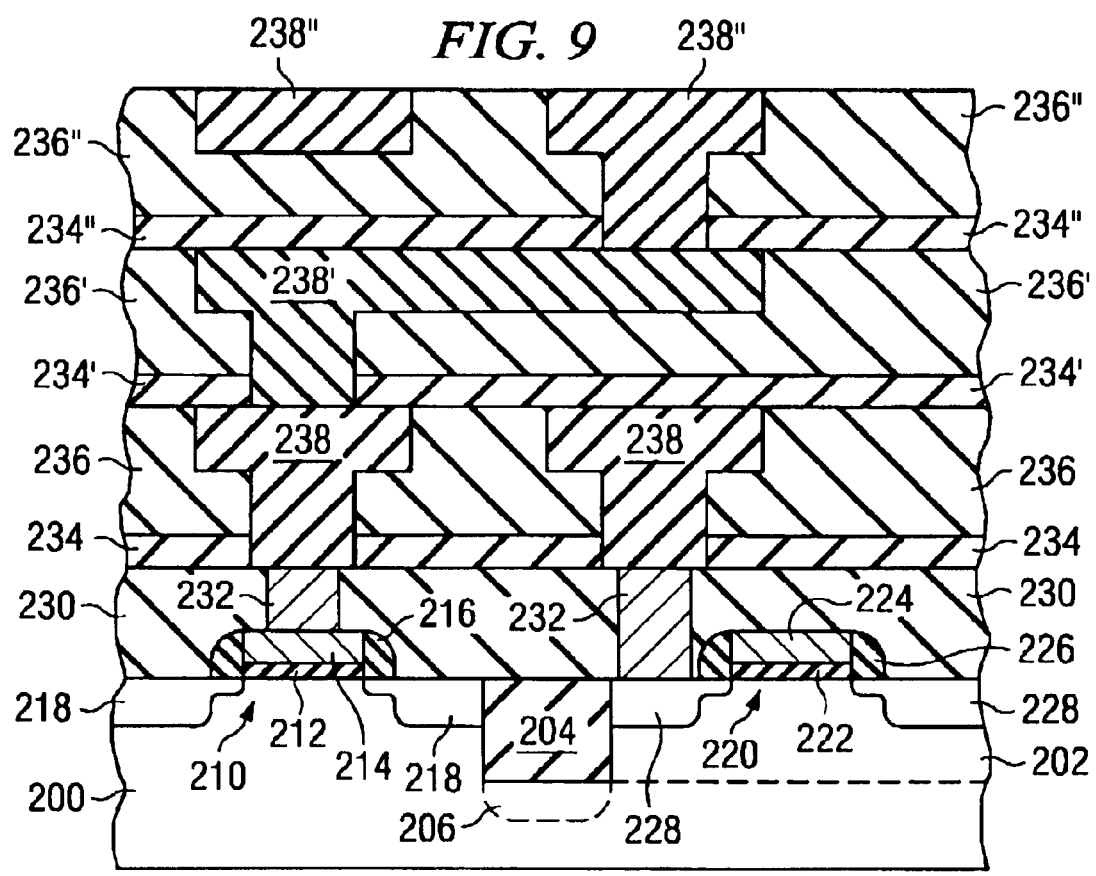

More than one layer of metalization can be included. FIG. 9 is provided to illustrate this fact. In this device three levels of metal 238, 238' and 238" are shown. While the illustrated embodiment shows three layers, it is understood that a semiconductor device of the preferred embodiment could include more (or fewer) than three layers of metalization. For example, a chip might include five to eight layers or more in 0.13 µm technology. Each of these layers could be processed using the steps described here.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, materials, and steps described in the specification. As one of ordinary skill in the art will readily appreciate from the disclosure of the present invention, processes, materials, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming a layer of low-k dielectric material;
   performing a plasma cure on the layer of low-k dielectric material; and
   after performing the plasma cure, removing an unpatterned top portion of the layer of low-k dielectric material.

2. The method of claim 1 wherein the low-k dielectric material comprises SiCOH.

3. The method of claim 1 wherein the low-k dielectric material is formed by chemical vapor deposition.

4. The method of claim 1 wherein the low-k dielectric material is formed by spin-on deposition.

5. The method of claim 1 wherein forming a layer of low-k dielectric material comprises forming a layer having a thickness between about 100 nm and about 800 nm.

6. The method of claim 5 wherein removing a top portion comprises removing between about 10 nm and about 150 nm of the material.

7. The method of claim 1 wherein removing a top portion of the layer of low-k dielectric material comprises removing between about 5% and about 25% of the layer.

8. The method of claim 1 wherein removing a top portion comprises etching the layer of low-k dielectric material.

9. The method of claim 8 wherein etching comprises etching using a gas containing fluorine.

* * * * *

UNITED STATES PATENT AND TRADEMARK OFFICE
CERTIFICATE OF CORRECTION

PATENT NO.    : 6,770,570 B2
DATED         : August 3, 2004
INVENTOR(S)   : Li et al.

It is certified that error appears in the above-identified patent and that said Letters Patent is hereby corrected as shown below:

Title page,
Item [56], References Cited, OTHER PUBLICATIONS, insert
-- THANAWALA, Shilpa, *et al.*, "Reduction in the Effective Dielectric Constant of Integrated Interconnect Structures Through an All-Spin-On Strategy," Honeywell Electronic Materials, Sunnyvalle, CA, pp. 1-6 --

Column 5,
Line 47, delete "SICOH" and insert therefor -- SiCOH --;

Column 6,
Line 64, insert the inadvertently omitted claims:

--10. The method of claim 1 wherein removing a top portion comprises performing a chemical-mechanical polish on the layer of low-k dielectric material.

11. The method of claim 1 wherein removing a top portion comprises performing a wet chemical etch on the layer of low-k dielectric material.

12. The method of claim 1 wherein removing a top portion comprises etching the layer of low-k dielectric material using an in situ HF vapor etch.

13 The method of claim 1 wherein removing a top portion comprises etching the layer of low-k dielectric material using an argon sputter procedure.

14. The method of claim 1 wherein performing a plasma cure comprises setting a plasma power to between about 50 W and about 3000 W, setting a pressure to between about 1 torr and about 7 torr, and exposing the layer to an $N_2/H_2$ gas.

UNITED STATES PATENT AND TRADEMARK OFFICE
CERTIFICATE OF CORRECTION

PATENT NO. : 6,770,570 B2
DATED : August 3, 2004
INVENTOR(S) : Li et al.

It is certified that error appears in the above-identified patent and that said Letters Patent is hereby corrected as shown below:

Column 6 (cont'd),

15. A method of forming a semiconductor device, the method comprising:
    forming a plurality of transistors in a semiconductor region, a first group of the plurality of transistors comprising n-channel MOS transistors and a second group of the plurality of transistors comprising p-channel MOS transistors;
    forming an insulating layer over the plurality of transistors;
    forming a low-k dielectric material over the insulating layer;
    plasma curing the low-k dielectric material;
    removing a top portion of the low-k dielectric material;
    etching a trench within the low-k dielectric material; and
    filling the trench with a conductive material.

16. The method of claim 15 and further comprising forming an etch stop layer over the insulating layer, the low-k dielectric layer being formed over the etch stop layer.

17. The method of claim 16 wherein the etch stop layer comprises a layer formed from a material selected from the group consisting of silicon nitride and silicon carbide.

18. The method of claim 15 wherein the low-k dielectric material comprises SiCOH.

19. The method of claim 15 wherein the conductive material comprises copper.

20. A method of forming a semiconductor device, the method comprising:
    providing a plurality of CMOS transistors, each transistor having a channel length of 130 nm or less;
    forming an oxide layer overlying the plurality of transistors;
    forming a SiCOH layer overlying the oxide layer, the SiCOH layer having a dielectric constant less than about 3, the SiCOH layer also having a thickness ;
    plasma treating the SiCOH layer;
    removing at least 5% of the thickness of the SiCOH layer from across the SiCOH layer;
    forming a trench within the SiCOH layer;
    forming a copper conductor disposed within the trench; and
    forming a plurality of contacts extending through the SiCOH layer and the oxide layer to electrically connect selected ones of the plurality of CMOS transistors with the copper conductor.

21. The method of claim 20 wherein the SiCOH layer has a dielectric constant between about 1.5 and about 3.0.

22. The device of claim 21 wherein the SiCOH layer has a dielectric constant of about 2.0.

23. The device of claim 20 wherein the SiCOH layer has a substantially uniform density.

24. The device of claim 20 and further comprising forming a second SiCOH layer overlying the SiCOH layer, the second SiCOH layer having a dielectric constant less than about 3.

UNITED STATES PATENT AND TRADEMARK OFFICE
CERTIFICATE OF CORRECTION

PATENT NO. : 6,770,570 B2
DATED : August 3, 2004
INVENTOR(S) : Li et al.

It is certified that error appears in the above-identified patent and that said Letters Patent is hereby corrected as shown below:

Column 6 (cont'd),

25. The device of claim 32 wherein the second SiCOH layer has a substantially uniform density.

26. The device of claim 24 and further comprising:
    forming a trench within the second SiCOH layer; and
    forming a copper conductor within the trench in the second SiCOH layer.

27. The device of claim 26 and further comprising:
    forming a third SiCOH layer overlying the SiCOH layer, wherein the third SiCOH layer has a substantially uniform density and a dielectric constant of less than about 3;
    forming a trench within the third SiCOH layer; and
    forming a copper conductor disposed within the trench in the third SiCOH layer.--

Signed and Sealed this

Fourteenth Day of December, 2004

JON W. DUDAS
*Director of the United States Patent and Trademark Office*